US006750948B2

(12) United States Patent
Omura

(10) Patent No.: US 6,750,948 B2
(45) Date of Patent: Jun. 15, 2004

(54) PROJECTION OPTICAL SYSTEM, PROJECTION EXPOSURE APPARATUS HAVING THE PROJECTION OPTICAL SYSTEM, PROJECTION METHOD THEREOF, EXPOSURE METHOD THEREOF AND FABRICATING METHOD FOR FABRICATING A DEVICE USING THE PROJECTION EXPOSURE APPARATUS

(75) Inventor: Yasuhiro Omura, Tokyo (JP)

(73) Assignee: Nikon Corporation, Tokyo (JP)

( * ) Notice: Subject to any disclaimer, the term of this patent is extended or adjusted under 35 U.S.C. 154(b) by 3 days.

(21) Appl. No.: 10/104,033

(22) Filed: Mar. 25, 2002

(65) Prior Publication Data

US 2002/0176063 A1 Nov. 28, 2002

Related U.S. Application Data

(63) Continuation of application No. 09/689,781, filed on Oct. 13, 2000.

(30) Foreign Application Priority Data

Oct. 15, 1999 (JP) .......................................... P11-294224

(51) Int. Cl.[7] .......................... G03B 27/42; G03B 27/70
(52) U.S. Cl. .......................................... 355/53; 355/66
(58) Field of Search ............................ 355/61, 66, 53, 355/52, 77

(56) References Cited

U.S. PATENT DOCUMENTS

| 5,063,586 A | 11/1991 | Jewell et al. |
| 5,153,898 A | 10/1992 | Suzuki et al. |
| 5,212,588 A | * 5/1993 | Viswanathan et al. ...... 359/355 |
| 5,220,590 A | 6/1993 | Bruning et al. |
| 5,315,629 A | * 5/1994 | Jewell et al. .................. 378/34 |
| 5,353,322 A | 10/1994 | Bruning et al. |
| 5,410,434 A | 4/1995 | Shafer |
| 5,477,304 A | 12/1995 | Nishi |
| 5,686,728 A | 11/1997 | Shafer |
| 5,805,346 A | 9/1998 | Tomimatsu |
| 5,805,365 A | 9/1998 | Sweatt |
| 5,815,310 A | 9/1998 | Williamson |
| 5,917,879 A | 6/1999 | Mashima |
| 5,956,192 A | 9/1999 | Williamson |
| 6,033,079 A | 3/2000 | Hudyma |

(List continued on next page.)

FOREIGN PATENT DOCUMENTS

| EP | 0 951 054 A1 | 10/1999 |
| EP | 0 962 830 A1 | 12/1999 |
| JP | 5-175098 | 7/1993 |
| JP | 8-330220 | 12/1996 |
| JP | 9-148241 | 6/1997 |
| JP | 10-284408 | 10/1998 |
| WO | WO 99/26097 | 5/1999 |
| WO | WO 99/42905 | 8/1999 |
| WO | WO 99/57596 | 11/1999 |

OTHER PUBLICATIONS

"Rapid Communications", Applied Optics, vol. 23, No. 14, Sep. 1, 1984.
"Expansion hysteresis upon thermal cycling of Zerodur", Jacobs et al., Applied Optics, vol. 23, No. 17, Sep. 1, 1984.
"Thermal expansion and length stability of Zerodur in dependence on temperature and time" Lindig et al., Applied Optics, vol. 24, No. 20, Oct. 15, 1985.

*Primary Examiner*—Russell Adams
*Assistant Examiner*—D. Ben Esplin
(74) *Attorney, Agent, or Firm*—Oliff & Berridge PLC

(57) ABSTRACT

A projection optical system having a large numerical aperture in a soft X-ray wavelength range of 200 nm or less, specifically 100 nm or less and a resolution drastically lower than 50 nm, and a projection exposure apparatus provided with the projection optical system.

20 Claims, 9 Drawing Sheets

U.S. PATENT DOCUMENTS

| | | | |
|---|---|---|---|
| 6,172,825 B1 * | 1/2001 | Takahashi | 359/859 |
| 6,188,513 B1 * | 2/2001 | Hudyma et al. | 359/366 |
| 6,195,213 B1 | 2/2001 | Omura et al. | |
| 6,213,610 B1 * | 4/2001 | Takahashi et al. | 359/858 |
| 6,259,510 B1 | 7/2001 | Suzuki | |
| 6,262,845 B1 | 7/2001 | Sweatt | |
| 6,285,737 B1 | 9/2001 | Sweatt et al. | |
| 6,353,470 B1 * | 3/2002 | Dinger | 355/71 |

* cited by examiner

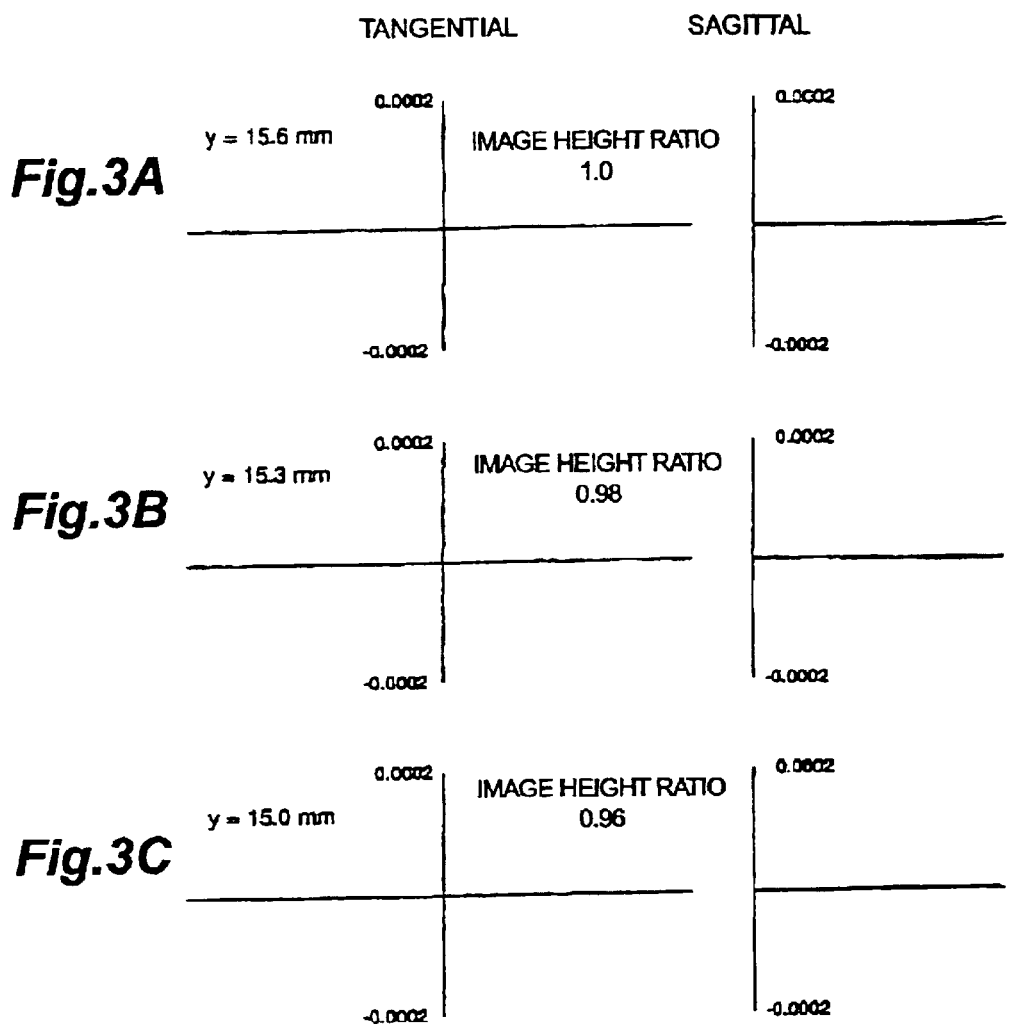

PROJECTION OPTICAL SYSTEM, PROJECTION EXPOSURE APPARATUS HAVING THE PROJECTION OPTICAL SYSTEM, PROJECTION METHOD THEREOF, EXPOSURE METHOD THEREOF AND FABRICATING METHOD FOR FABRICATING A DEVICE USING THE PROJECTION EXPOSURE APPARATUS

BACKGROUND OF THE INVENTION

1. Field of the Invention

The present invention relates to a projection optical system for a projection exposure apparatus to be employed when a semiconductor element or a liquid crystal display element is to be manufactured by the photolithographic process, a projection exposure apparatus provided with the projection optical system, Projection Method thereof, Exposure Method thereof and Fabricating Method for fabricating a device using the projection exposure apparatus, and, more particularly, to a projection optical system for a scanning type projection exposure apparatus and having a resolution of 0.1 microns or less in an ultraviolet region

2. Related Background Art

In the photolithographic process for manufacturing a semiconductor element or the like, there has been employed a projection exposure apparatus for projecting and exposing a pattern image formed on a photo mask or reticle (as will be generally called the "reticle"), through a projection optical system to a wafer or glass plate to which a photoresist or the like is applied. As the degree of integration of the semiconductor element or the like grows higher, there rises higher the resolution which is demanded for the projection optical system employed in the projection exposure apparatus. In order to satisfy this demand, it is necessary to shorten the wavelength of an illumination radiation (or exposure radiation) and to enlarge the numerical aperture (as will be abbreviated into the "NA") of the projection optical system, or to effect the-both. When the illumination radiation has a wavelength of 180 nm or less, for example, it is possible to achieve a high resolution of 0.1 microns or less.

As the wavelength of the illumination radiation is the-shorter, the kind of a practical glass material is the-more limited by the optical absorption. Especially when the wavelength is as short as 180 nm or less, what can be practiced as the glass material is limited to only fluorite. When the wavelength is shorter than 100 nm, moreover, there is no glass material to be employed as the refractive lens. It is, therefore, necessary to develop an optical system employing no refractive lens or only an extremely small number of refractive lenses.

Several techniques for constructing the projection optical system have been proposed by the reflection type optical system employing no refractive lens or the reflection type optical system employing an extremely small number of refractive lenses. For example, an optical system having an aperture as large as the NA exceeding 0.2 on the image side has been disclosed in U.S. Pat. Nos. 5,815,310 and 5,686,728.

However, the optical systems disclosed are not sufficiently corrected in aberration when the numerical aperture on the image side exceeds 0.3 and when an emitted radiation in a soft X-ray range of a wavelength of 100 nm or less is used. Therefore, the optical systems thus far described cannot provide a sufficient optical performance if employed as the projection optical system having a resolution of 30 nm or less.

SUMMARY OF THE INVENTION

The object of the invention is to provide a projection optical system having a large numerical aperture in a soft X-ray wavelength range of 200 nm or less, specifically 100 nm or less and a resolution drastically lower than 50 nm, and a projection exposure apparatus provided with the projection optical system.

In order to solve the above-specified problem, according to the invention, there is provided a projection optical system for projecting the image of a first plane on a second plane, comprising: an arcuate field area spaced away from the optical axis of the projection optical system; and a shading area in a pupil plane of the projection optical system.

In the invention, on the other hand, the projection optical system further comprises: a first imaging optical system for forming an intermediate image of said first plane; and a second imaging optical system for forming the final image of said first plane on said second plane on the basis of an emitted radiation from said intermediate image. Said first imaging optical system includes at least two reflecting surfaces, and said second imaging optical system includes at least one reflecting surface having an optically transmissive portion.

In the invention, on the other hand, said shading area has a ring shape (doughnut shape).

According to the invention, on the other hand, there is provided a projection optical system for projecting the image of a first plane on a second plane, comprising: a first imaging optical system for forming an intermediate image of said first plane; and a second imaging optical system for forming the final image of said first plane on said second plane on the basis of an emitted radiation from said intermediate image, wherein said first imaging optical system includes at least two reflecting surfaces, and said second imaging optical system includes at least one reflecting surface having an optically transmissive portion.

In the invention, on the other hand, the projection optical system further comprises: a first imaging optical system for forming an intermediate image of said first plane; and a second imaging optical system for forming the final image of said first plane on said second plane on the basis of an emitted radiation from said intermediate image, wherein said first imaging optical system includes at least one reflecting surface of a positive power, and at least one reflecting surface of a negative power, wherein said second imaging optical system includes a primary mirror disposed in the vicinity of said intermediate image, and an auxiliary mirror disposed closer to said second plane than said primary mirror, wherein said primary mirror has a first optically transmissive portion and a first reflecting surface of a positive power (a concave shape), and wherein said auxiliary mirror has a second optically transmissive portion and a second reflecting surface, whereby: the emitted radiation from said intermediate image is reflected through said first optically transmissive portion of said primary mirror on said second reflecting surface of said auxiliary mirror; the emitted radiation, as reflected on said second reflecting surface of said auxiliary mirror, is reflected on said first reflecting surface of said primary mirror; and the emitted radiation, as reflected on said first reflecting surface of said primary mirror, is transmitted through said second optically transmissive portion of said auxiliary mirror to form said final image on said second plane. Further, the power on the reflecting surface is an inverse number of a focal distance of said reflecting surface.

In the invention, on the other hand, all the optical elements composing said projection optical system are reflecting surfaces.

In the invention, on the other hand, the projection optical system further comprises: a first imaging optical system for forming an intermediate image of said first plane; and a second imaging optical system for forming the final image of said first plane on said second plane on the basis of an emitted radiation from said intermediate image, wherein said first imaging optical system includes at least one refractive lens component, and wherein said projection optical system is a telecentric optical system on the sides of said first plane and said second plane.

In the invention, on the other hand, all the optical elements composing said projection optical system are positioned to have their optical axes on a common straight line.

In the invention, on the other hand, the projection optical system further comprises: a first imaging optical system for forming an intermediate image of said first plane; and a second imaging optical system for forming the final image of said first plane on said second plane on the basis of an emitted radiation from said intermediate image, wherein said projection optical system is a telecentric optical system on the side of said second plane, and wherein a shading member for forming said shading area is arranged in the vicinity of a pupil plane in said first imaging optical system.

In the invention, on the other hand, the projection optical system further comprises a first imaging optical system for forming an intermediate image of said first plane; and a second imaging optical system for forming the final image of said first plane on said second plane on the basis of an emitted radiation from said intermediate image, wherein said first imaging optical system includes a reflecting mirror arranged in the vicinity of the pupil plane, and wherein the reflecting surface of said reflecting mirror includes a reflective area having a predetermined reflectivity, and a low reflectivity area having a lower reflectivity than that of said reflective area. Here, the low reflectivity area includes an area (non-reflective area) which does not reflect the emitted radiation, thereby the shape of the shading area on the pupil plane is substantially equal among the pupil planes corresponding to the emitted radiation from any of positions of the field area.

According to the invention, there is provided a projection exposure apparatus for projecting and transferring the image of a mask having a predetermined pattern to a photosensitive substrate, comprising: a radiation source for feeding an emitted radiation of a predetermined wavelength; a projection optical system according to the above invention; a first stage for positioning said mask on said first plane; and a second stage for positioning said photosensitive substrate on said second plane.

Here, the invention is preferred to have any of the following constructions (1) to (5):

(1) It is preferable that said projection optical system has at least two aspherical reflecting surfaces;

(2) It is preferable that the field stop is disposed in the vicinity of said intermediate image;

(3) It is preferable that said projection optical system has a reflecting surface and that a substrate having said reflecting surface has a linear expansion coefficient of 3 ppm/° C. or less;

(4) It is preferable that said projection optical system includes a primary mirror having a first optically transmissive portion and a first reflecting surface, and an auxiliary mirror having a second optically transmissive portion and a second reflecting surface, that an aperture stop is disposed between said primary mirror and said auxiliary mirror, that the emitted radiation having passed through said first optically transmissive portion of said primary mirror is reflected on the second reflecting surface of said auxiliary mirror, that the emitted radiation reflected on said second reflecting surface of said auxiliary mirror is reflected on the first reflecting surface of said primary mirror, and that the emitted radiation reflected on the said first reflecting surface of said primary mirror is guided through said second optically transmissive portion of said auxiliary mirror to form said final image on said second plane; and (5) It is preferable that there are included a primary mirror having a first optically transmissive portion and a first reflecting surface and an auxiliary mirror having a second optically transmissive portion and a second reflecting surface, and that a shading member is arranged between said primary mirror and said auxiliary mirror.

In the invention, on the other hand, it is preferable that said first optically transmissive portion is formed in an area surrounded by the area of said first reflecting surface, and that said second optically transmissive portion is formed in an area surrounded by the area of said second reflecting surface.

According to another aspect of the invention, on the other hand, there is provided a projection optical system for projecting the image of a first plane on a second plane, comprising: a primary mirror including a first optically transmissive portion and a first reflecting surface formed in an area surrounding said first optically transmissive portion; and an auxiliary mirror including a second optically transmissive portion and a second reflecting surface formed in an area surrounding said second optically transmissive portion, wherein said first and second reflecting surfaces form at least three optical paths between said first and second reflecting surfaces, and wherein said first and second optically transmissive portions are formed at a position which does not contain an optical axis formed by said first and second reflecting surfaces.

According to another aspect of the invention, on the other hand, there is provided a projection optical system for projecting the image of a first plane on a second plane, comprising: a primary mirror including a first optically transmissive portion and a first reflecting surface formed in an area surrounding said first optically transmissive portion; and an auxiliary mirror including a second optically transmissive portion and a second reflecting surface formed in an area surrounding said second optically transmissive portion, wherein said first and second reflecting surfaces are formed at a position which contains an optical axis formed by said first and second reflecting surfaces, and wherein said first and second optically transmissive portions are formed at a position which does not contain said optical axis.

It is preferable that any of the aforementioned constructions further comprises a reflecting mirror having a reflecting surface at a position spaced away from said optical axis. In this case, moreover, it is preferable that said reflecting mirror is arranged on the side of said first plane of said primary mirror and said auxiliary mirror.

On the other hand, it is preferable that any of the aforementioned constructions comprises a shading member for shading the emitted radiation which passes not through said first and second reflecting surfaces but through said first and second optically transmissive portions.

According to the invention, on the other hand, there is provided a projection exposure apparatus for projecting and transferring the image of a mask having a predetermined pattern to a photosensitive substrate, comprising: a radiation source for feeding an emitted radiation of a predetermined wavelength; a projection optical system of the present invention; a first stage for positioning said mask on said first plane; and a second stage for positioning said photosensitive substrate on said second plane.

On the other hand, said projection exposure apparatus is preferred to have any of the following constructions (6) to (10):

(6) It is preferable that said mask is of a reflection type for selectively reflecting said emitted radiation selectively:

(7) It is preferable in the present invention or said construction (6) that said radiation source feeds an emitted radiation of 200 nm or less;

(8) It is preferable in said construction (7) that said radiation source feeds an emitted radiation of 160 nm or less;

(9) It is preferable in said construction (8) that said radiation source feeds an emitted radiation of 100 nm or less; and

(10) It is preferable in the present invention or any of said constructions (6) to (9) that said first stage is disposed to move in a direction across the longitudinal direction of said arcuate field of view, and that said second stage is disposed to move in a direction across the longitudinal direction of the final image of said arcuate field of view.

According to the invention, on the other hand, there is provided a projection exposure method for projecting and transferring the image of a mask having a predetermined pattern to a photosensitive substrate, comprising: preparing a projection optical system according to-the present invention or any of said constructions; arranging said mask on said first plane of said projection-optical system; arranging said-photosensitive substrate on said second plane of said projection optical system; and feeding an emitted radiation of a predetermined wavelength to said mask arranged on said first plane, thereby to form the image of said mask on said photosensitive substrate arranged on said second plane.

It is preferable that said projection exposure method has any of the following constructions (11) to (16):

(11) It is preferable that said emitted radiation is reflected on said mask and guided to said projection optical system;

(12) It is preferable that an emitted radiation of a wavelength of 200 nm or less is fed to said mask;

(13) It is preferable in said item (12) that an emitted radiation of a wavelength of 160 nm or less is fed to said mask;

(14) It is preferable in said item (13) that an emitted radiation of a wavelength of 100 nm or less is fed to said mask;

(15) It is preferable in any of the aforementioned items that the projection exposure is performed while changing the relative positions between said photosensitive substrate and said projection optical system; and

(16) It is preferable in said item (15) that the direction to change said position crosses the longitudinal direction of said arcuate field of view of said projection optical system.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIGS. 3A, 3B and 3C are diagrams illustrating a transverse aberration of the projection optical system according to the first embodiment;

DESCRIPTION OF THE PREFERRED EMBODIMENTS

The invention will be described in connection with its embodiments with reference to the accompanying drawings.

[First Embodiment]

A schematic construction of a projection optical system according to a first embodiment of the invention will be described with reference to FIG. 1.

The projection optical system TL is suited for a later-described scanning type projection exposure apparatus and is constructed to include: a first imaging optical system K1 for forming an intermediate image I1 of the pattern of a mask M on a first plane; and a second imaging optical system K2 based on the emitted radiation from the intermediate image I1 for forming a final image I2 of the pattern of the mask M at a reduced magnification on a photosensitive substrate or wafer W. Moreover, this projection optical system is a telecentric on the wafer side.

The first imaging optical system K1 is constructed to include a reflecting mirror M1 of a positive power (a concave shape), a reflecting mirror of a negative power (a convex shape), a convex reflecting mirror M3 of a negative power and a concave reflecting mirror M4 of a positive power. The emitted radiation, as emitted from a radiation source 1, irradiates the mask and the emitted radiation from the mask M is reflected sequentially through those four reflecting mirrors M1 to M4 so that the intermediate image I1 of the pattern of the mask M is formed. On the other hand, the second imaging optical system K2 is constructed to include a primary mirror Ms of a positive power disposed near the intermediate image I2, and an auxiliary mirror MF disposed closer to the wafer W than the primary mirror MS. This primary mirror MS has a first aperture AP1 and a reflecting surface of a negative power. On the other hand, the auxiliary mirror MF has a second aperture AP2.

The emitted radiation from the intermediate image I1 is reflected through the first aperture AP1 of the primary mirror MS on the reflecting surface of the auxiliary mirror MF; the emitted radiation, as reflected on the reflecting surface of the auxiliary mirror MF, is reflected on the first reflecting surface of the primary mirror MS; and the emitted radiation, as reflected on the first reflecting surface of the primary mirror MS, forms the final image I2 through the second aperture AP2 of the auxiliary mirror MF on the wafer W.

The first imaging optical system K1 is required to have at least one concave mirror M4 for forming the intermediate image I1. With at least one convex mirror M3, moreover, it is possible to adjust the Petzval's sum of the entire optical system to 0.

Figure 1:
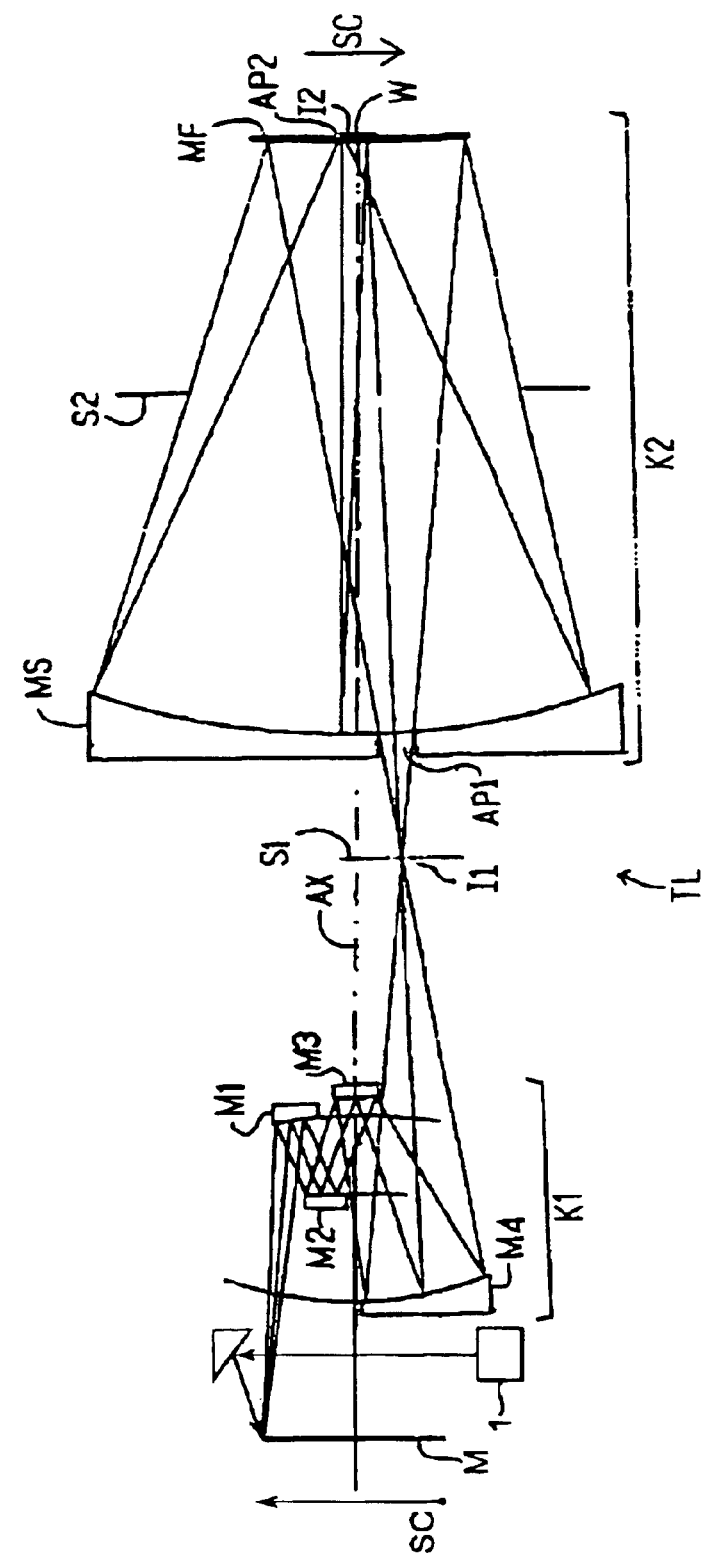
FIG. 1 is a diagram showing a lens construction of a projection optical system according to a first embodiment.

On the other hand, the exposed area is an arcuate area having a radius of 15.0 to 15.6 mm on an optical axis AX, and a field size of a width of 16 mm can be used in the scanning direction, as indicated by arrow SC in FIG. 1.

Figure 2B:
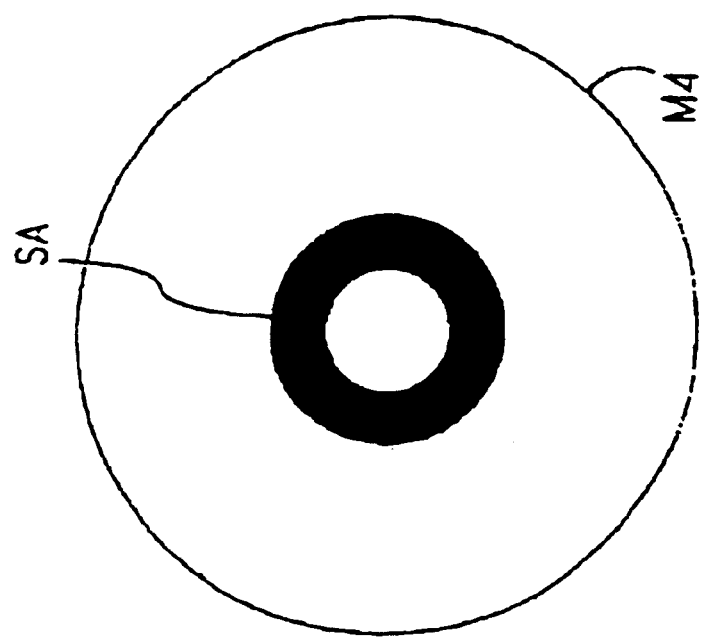
FIGS. 2A and 2B are diagrams for explaining the shaded region of the projection optical system according to the first embodiment.
Figure 2A:
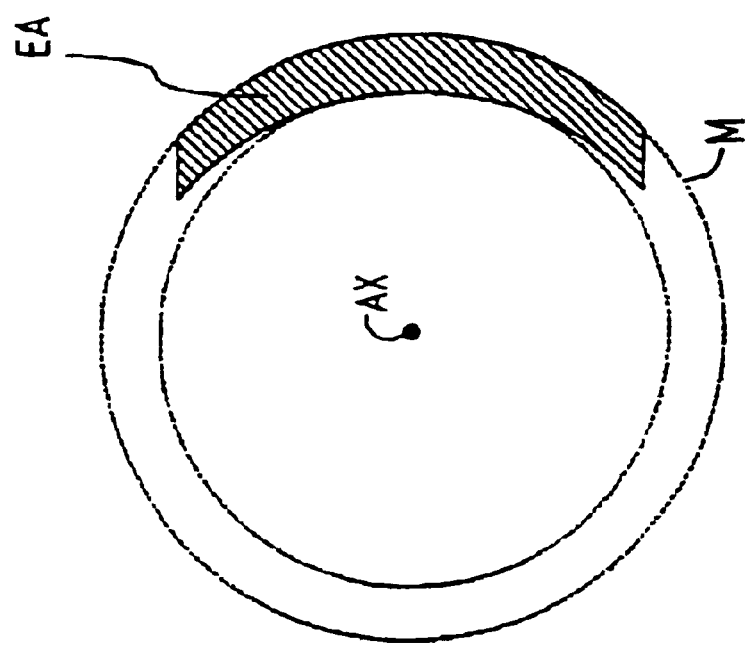

The projection optical system according to this embodiment is of a reflection optical type so that its optical path has to be separated into a forward path and a backward path. Therefore, a first description will be made on the separation of the forward/backward optical paths. The exposed area on the mask M of the projection optical system is an arcuate area EA outside of (i.e. spaced away from) the optical axis AX, as shown in FIG. 2A. In the first imaging optical system K1, moreover, the exposed area off the axis is utilized to make the so-called "OFF-AXIS type forward/backward optical path separation". On the other hand, the primary mirror MS and the auxiliary mirror ME of the second imaging optical system K2 have the first aperture API and the second aperture AP2, respectively, as described above. In the second imaging optical system K2, moreover, these apertures are utilized to make the so-called "center shading type forward/backward optical path separation". In order to eliminate the unnecessary emitted radiation, as might otherwise reach the wafer W directly from the first and second apertures AP1 and AP2, a ring-shaped shading area SA, as shown in FIG. 2B, is disposed at the reflecting mirror M4 providing a pupil plane.

The shading area SA will invite, if too large, a deterioration of the imaging performance so that it is desired to be as small as possible. Therefore, the optical system is so arranged that the emitted radiation may pass through the aperture at the image conjugate position where the opening of the luminous flux is small and that the emitted radiation may be reflected at the position, where the opening of the luminous flux is large, by the reflecting surfaces of the primary mirror MS and the auxiliary mirror MF. If the aperture is arranged at the image conjugate position, on the other hand, its effective area takes an arcuate shape. Therefore, the shading area can be reduced by forming the shading area SA in the pupil into the ring shape, as shown in FIG. 2B. With this ring-shaped shading area SA, moreover, the emitted radiation to pass through the vicinity of the center of the pupil plane can be utilized to decrease the shaded ratio of the diffracted radiation generated at the mask M but increase the ratio of interference between the 0-th degree diffracted radiation and the ± first degree diffracted radiation, thereby to prevent the degradation of the contrast of the final image I2.

With the construction thus far described, a resolution of 30 nm or less can be achieved while the shading area SA in the pupil being kept small. Since the present projection optical system is telecentric on the side of the wafer W, on the other hand, it is possible to reduce the image distortion due to the deviation in the optical axis, as caused by the deflection or the like of the wafer.

On the other hand, the shading area SA of the convex mirror M3 near the pupil plane in the first imaging optical system K1 is desired to have the shading member arranged to shade the emitted radiation. With this construction, the position and the size of the shading area SA can be made substantially identical with respect to the emitted radiation from the entire area of the screen. As a result, the imaging performance can be made substantially identical in the screen. Here this shading area SA can be formed by forming on the reflecting surface of the convex mirror M3 the reflecting area having a predetermined reflectivity and a low reflecting area having a lower reflectivity than that of the former reflecting area. Moreover, the reflectivity of the low reflecting area is desired to be substantially zero or extremely low.

Thus, "shading" in the expression "shading area" as used herein means blocking light by preventing the light from being reflected on a mirror surface. In other words, "shading" means that a part of the light bundle (light beam) is not reflected, and thus a part of the region of the light bundle (or light beam) is blocked as shown, for example, at SA in FIG. 2B. "Obscuration area" is an appropriate alternative phrase for "shading area".

On the other hand, the present projection optical system has six aspherical planes (e.g., ASP1 in lens data, as will be described hereinafter). By thus introducing the aspherical planes, the resolution can be improved. The projection optical system further has a field stop S1 in the vicinity of the intermediate image I1 formed by the first imaging optical system K1. This field stop S1 makes it possible to prevent the stray radiation, as generated on the side of the mask M, from reaching the wafer W. In addition, all the optical elements composing the present projection optical system have the reflecting surfaces. As a result, the finer pattern images, as formed on the mask M by exemplifying the exposure radiation by a soft X-ray beam having a wavelength of 100 nm or less, can be projected on and transferred to the wafer W. On the other hand, a shading member may be disposed in the vicinity of the optical axis AX between the primary mirror MS and the auxiliary mirror MF.

On the other hand, the substrate having the reflecting surface has a linear expansion coefficient of 3 ppm/°C or less. ULE (Trademark) sold by Corning has such a linear expansion coefficient and ULE (Ultra Low Expansion Titanium Silicate Glass) has $5 \times 10_{-8} = 0.55$ ppm/°C (See Applied Optics, Vol. 24, p3330 (1985); Vol. 23, p2852, P3014(1984). This makes it possible to prevent the reflecting mirror from being changed in shape and deteriorated in imaging performance during the projection exposure. Moreover, the optical axes AX of all the optical elements composing the projection optical system are aligned on the common straight line. As a result, the projection optical system can be easily assembled or adjusted to establish a sufficient imaging performance. In addition, the numerical aperture of the projection optical system can be made variable by arranging an aperture stop S2 in the forward/backward optical paths between the primary mirror MS and the auxiliary mirror MF of the second imaging optical system K2.

The various items of the projection optical system according to the first embodiment are enumerated in Table 1. In Table 1: the numerals at the left end designate the sequences of the lens surfaces from the side of the mask M (or the first plane); letter r designates the radius of curvature of the corresponding lens surface; letter d designates the distance on the optical axis from the corresponding lens surface to a next lens surface; letter β designates the magnification of the entirety of the projection optical system; letters NA designate the numerical aperture of the wafer side (or the second plane side); and letter λ designates the reference wavelength.

Signs of the radius of curvature r is positive when a center of curvature of the reflecting surface (lens surface) positive the second surface side of the reflecting surface (the lens surface), and signs of the radius of curvature r is negative when a center of curvature of the reflecting surface (lens surface) position the first surface side of the reflecting surface (the lens surface). In the column relating to the surface distance d, each time the radiation is reflected by a reflecting surface, the sign changes.

Moreover, letters ASP in the lens data designate the aspherical planes. In the individual embodiments, the aspherical plane is expressed by the following numerical Formula, if: the height in the direction perpendicular to the optical axis is designated by y; the distance (i.e., sag) taken along the optical axis from the tangential plane at the apex of the aspherical plane to a position at the height y on the aspherical plane is designated by Z; the curvature (=1/radius of curvature) is designated by c; the coefficient of circular cone is designated by K; and the coefficients of the aspherical plane of an n-th degree are designated by A to G:

$$Z=(c \cdot Y^2)/[1+\{1-(1+K) \cdot c^2 y^2\}^{1/2}]+A \cdot y^4+B \cdot Y^6+C \cdot Y^8+D \cdot y^{10}+E \cdot Y^{12}+F \cdot Y^{14}+G \cdot Y^{16}.$$ [Formula 1]

Here, the items of all the following embodiments will use reference letters similar to those of the present embodiment. The units of the radius r of curvature and the distance d on the optical axis in the items of the individual embodiments can be exemplified by all"mm".

TABLE 1

(Entire Items)

|β| = 1/6
NA = 0.4
λ = 13.4 nm (Lens Data)

| Plane No. | r | d | Parts No. | ASP No. |
|---|---|---|---|---|
| Object Plane | ∞(Plane) | 229.7827 | | |
| 1 | −14490.6822 | −81.8895 | M1 | (ASP1) |
| 2 | −952.9808 | 101.1397 | M2 | (ASP2) |
| 3 | 232.5288 | −212.2304 | M3 | (ASP3) |
| 4 | 370.8704 | 602.3987 | M4 | (ASP4) |
| 5 | 778.9512 | 616.013 | | (ASP5) |
| 6 | 1853.2366 | −616.013 | MF | (ASP6) |
| 7 | 778.9512 | 616.013 | MS | (ASP5) |
| 8 | 1853.2366 | 10.000 | | (ASP6) |

TABLE 1-continued

Image Plane ∞(Plane)
(ASP Coefficient)

ASP 1

K = 0.0
A = −3.77519 × 10$^{-9}$  B = +4.73841 × 10$^{-13}$  C = −1.29002 × 10$^{-16}$
D = +2.36639 × 10$^{-20}$  E = −2.61697 × 10$^{-24}$  F = +1.61937 × 10$^{-28}$
G = −4.29843 × 10$^{-33}$

ASP2

K = 0.0
A = +1.61875 × 10$^{-9}$  B = +5.62543 × 10$^{-13}$  C = −4.90434 × 10$^{-17}$
D = +5.45619 × 10$^{-20}$  E = −2.48455 × 10$^{-23}$  F = +5.68776 × 10$^{-27}$
G = −5.27294 × 10$^{-31}$

ASP3

K = 0.0
A = −5.74815 × 10$^{-8}$  B = +6.88376 × 10$^{-12}$  C = +2.00960 × 10$^{-15}$
D = −2.96733 × 10$^{-17}$  E = +1.11935 × 10$^{-19}$  F = −2.18345 × 10$^{-22}$
G = +1.82877 × 10$^{-25}$

ASP4

K = 0.0
A = −4.61168 × 10$^{-10}$  B = −2.64132 × 10$^{-15}$  C = −2.21826 × 10$^{-20}$
D = +2.49734 × 10$^{-25}$  E = −2.31176 × 10$^{-29}$  F = +8.13793 × 10$^{-34}$
G = −1.29461 × 10$^{-38}$

ASP5

K = 0.0
A = −4.67711 × 10$^{-11}$  B = +8.24334 × 10$^{-17}$  C = +1.57264 × 10$^{-22}$
D = −2.45315 × 10$^{-29}$  E = +6.27355 × 10$^{-33}$  F = −6.45388 × 10$^{-38}$
G = +3.10016 × 10$^{-43}$

ASP6

K = 0.0
A = +2.15021 × 10$^{-9}$  B = +9.30299 × 10$^{-15}$  C = +6.80563 × 10$^{-20}$
D = +1.03608 × 10$^{-24}$  E = −5.84000 × 10$^{-29}$  F = +3.81817 × 10$^{-33}$
G = −9.15374 × 10$^{-38}$

FIGS. 3A, 3B and 3C illustrate transverse aberrations (or coma-aberrations) in the meridian direction (i.e., the tangential direction) and in the sagittal direction of the projection optical system according to the present embodiment. In FIGS. 3A, 3B and 3C, the letter y designates the image height. The aberration diagrams of all the following embodiments use reference letters similar to those of the present embodiment. In the projection optical system of the present embodiment, as apparent from the aberration diagram, the aberrations are corrected in a satisfactory balance in the whole exposed area. For the exposure wavelength, on the other hand, all the wavelengths could be employed, and a sufficient resolution can be obtained even with a soft X-ray of about 13 nm.

Generally, the resolution W of the projection optical system is expressed by the following Formula:

$$W=k \cdot \lambda/NA.$$

This coefficient k can be achieved at 0.5 or less according to the existing technical level. Therefore, a resolution of 20 nm or less can be obtained in the present embodiment.

[Second Embodiment]

Figure 4:
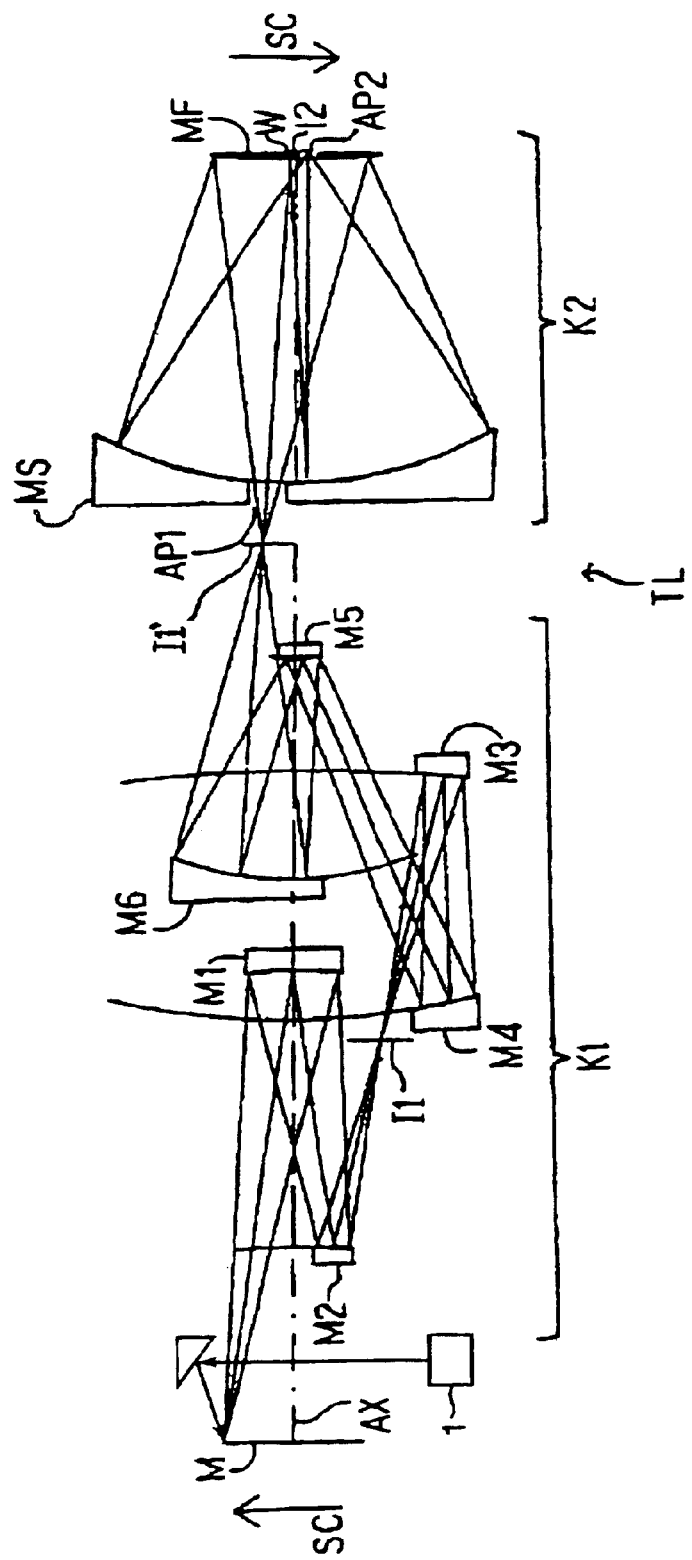
FIG. 4 is a diagram showing a lens construction of a projection optical-system according to a second embodiment.

FIG. 4 is a diagram showing a schematic construction of a projection optical system according to a second embodiment. The present projection optical system is suited for the scanning type projection exposure apparatus and is constructed to include: a first imaging optical system K1 for forming two intermediate images I1 and I1' of the pattern of a mask M or a first plane; and a second imaging optical system K2 based on the emitted radiation from the intermediate image I1' for forming a final image I2 of the pattern of the mask M at a reduced magnification on a photosensitive substrate or wafer W. Here, the first imaging optical system further includes: a first auxiliary imaging optical system for forming the first intermediate image I1; and a second auxiliary imaging optical system for forming the second intermediate image I1'. Of these two intermediate images, on the other hand, the image I1 is formed in the first imaging optical system K1 Moreover, the present projection optical system is a teleccentric one on the wafer side, and all the optical elements composing the projection optical system have their optical axes aligned on the common straight line AX.

The first imaging optical system K1 is constructed to include a reflecting mirror M1 of a positive power (a concave mirror), a reflecting mirror M2 of a negative power (a convex shape), reflecting mirrors M3 and M4 of positive powers (concave shapes), a reflecting mirror M5 of a negative power (a convex shape) and a reflecting mirror M6 of a positive power (a concave shape). The emitted radiation, as emitted from a radiation source 1, irradiates the mask and the emitted radiation from the mask H is reflected through the reflecting mirrors M1 and M2 so that the first intermediate image I1 of the pattern of the mask M is formed. And, the emitted radiation from the first intermediate image I1 is reflected sequentially through the reflecting mirrors M3 to M6 to form the second intermediate image I1'.

On the other hand, the second imaging optical system K2 is constructed to include a primary mirror MS of a positive power (a concave shape) disposed in the vicinity of the second intermediate image I1', and an auxiliary mirror MF disposed closer to the wafer W than the primary mirror MS. This primary mirror MS has a first aperture AP1 and a reflecting surface of a positive power (a concave shape). On the other hand, the auxiliary mirror MF has a second aperture AP2.

The emitted radiation from the second intermediate image I1' is reflected through the first aperture AP1 of the primary mirror MS on the reflecting surface of the auxiliary mirror MF; the emitted radiation, as reflected on the reflecting surface of the auxiliary mirror MF, is reflected on the first reflecting surface of the primary mirror MS; and the emitted radiation, as reflected on the first reflecting surface of the primary mirror MS, forms the final image I2 on the wafer W through the second aperture AP2 of the auxiliary mirror MF.

On the other hand, the exposed area is an arcuate area having a radius of 17.4 to 18.0 mm on an optical axis AX, and a field size of a width of 22 mm can be used in the scanning direction, as indicated by arrow SC in FIG. 4.

On the other hand, the shading area SA is formed in the reflecting mirror M1. The shape of the shading area and the method of separating the forward/backward optical paths in the present embodiment are similar to those of the first embodiment, and their description will be omitted. Here in the present embodiment, in the first imaging optical system K1, the OFF-AXIS type optical path separation is performed in the two, i.e., first and second auxiliary imaging optical systems, and the center shading type optical path separation is performed in the one, i.e., second imaging optical system K2. However, the invention should not be limited thereto, but may also perform the OFF-AXIS type optical path separation with one optical system and the center shading type optical separation with the two optical systems.

The item values of the projection optical system according to the second embodiment are enumerated in Table 2. Here, the symbols appearing in Table 2 have definitions similar to those of Table 1, and the aspherical plane ASP is expressed by the foregoing Formula.

TABLE 2

(Entire Items)

$|\beta| = 1/6$
NA = 0.55
$\lambda = 13.4$ nm (Lens Data)

| Plane No. | R | d | Parts No. | ASP No. |
|---|---|---|---|---|
| Object Plane | ∞(Plane) | 746.6105 | | |
| 1 | −723.0529 | −440.5503 | M1 | (ASP1) |
| 2 | −1745.5483 | 762.3215 | M2 | (ASP2) |
| 3 | −3209.6344 | −402.0086 | M3 | (ASP3) |
| 4 | 1082.6683 | 580.5244 | M4 | (ASP4) |
| 5 | 201.6806 | −353.5180 | M5 | (ASP5) |
| 6 | 502.6918 | 637.3296 | M6 | (ASP6) |
| 7 | 644.8260 | 501.0113 | | (ASP7) |
| 8 | 1895.6942 | −501.0113 | MF | (ASP8) |
| 9 | 644.8260 | 501.0113 | MS | (ASP7) |
| 10 | 1895.6942 | 12.0000 | | (ASP8) |

Image Plane ∞(Plane)
(ASP Coefficient)

ASP 1

$K = 0.0$
$A = -1.00941 \times 10^{-10}$  $B = -3.38154 \times 10^{-16}$  $C = -7.93150 \times 10^{-20}$
$D = +2.23178 \times 10^{-23}$  $E = -2.13046 \times 10^{-27}$  $F = 0.0$
$G = 0.0$

ASP2

$K = 0.0$
$A = -2.11134 \times 10^{-9}$  $B = +1.83710 \times 10^{-14}$  $C = -2.43647 \times 10^{-18}$
$D = +1.65197 \times 10^{-22}$  $E = -8.27104 \times 10^{-27}$  $F = 0.0$
$G = 0.0$

ASP3

$K = 0.0$
$A = -4.06226 \times 10^{-10}$  $B = -1.69785 \times 10^{-15}$  $C = +1.94147 \times 10^{-20}$
$D = -1.12776 \times 10^{-25}$  $E = +2.62277 \times 10^{-31}$  $F = 0.0$
$G = 0.0$

ASP4

$K = 0.0$
$A = -1.97872 \times 10^{-10}$  $B = -6.72995 \times 10^{-16}$  $C = -1.23672 \times 10^{-21}$
$D = +4.10935 \times 10^{-27}$  $E = -3.86642 \times 10^{-32}$  $F = 0.0$
$G = 0.0$

ASP5

$K = 0.0$
$A = -1.19524 \times 10^{-9}$  $B = +3.97155 \times 10^{-13}$  $C = +4.27744 \times 10^{-17}$
$D = -2.22397 \times 10^{-20}$  $E = +5.37147 \times 10^{-25}$  $F = 0.0$
$G = 0.0$

ASP6

$K = 0.0$
$A = +3.37816 \times 10^{-11}$  $B = +1.17850 \times 10^{-16}$  $C = +1.24652 \times 10^{-21}$
$D = -6.08219 \times 10^{-27}$  $E = +2.39759 \times 10^{-31}$  $F = -4.01656 \times 10^{-37}$
$G = 0.0$

ASP7

$K = 0.0$
$A = +6.24436 \times 10^{-11}$  $B = +1.99597 \times 10^{-16}$  $C = +5.07446 \times 10^{-22}$
$D = +1.55185 \times 10^{-27}$  $E = +5.76561 \times 10^{-34}$  $F = +2.38959 \times 10^{-38}$
$G = 0.0$

ASP8

Figure 5:
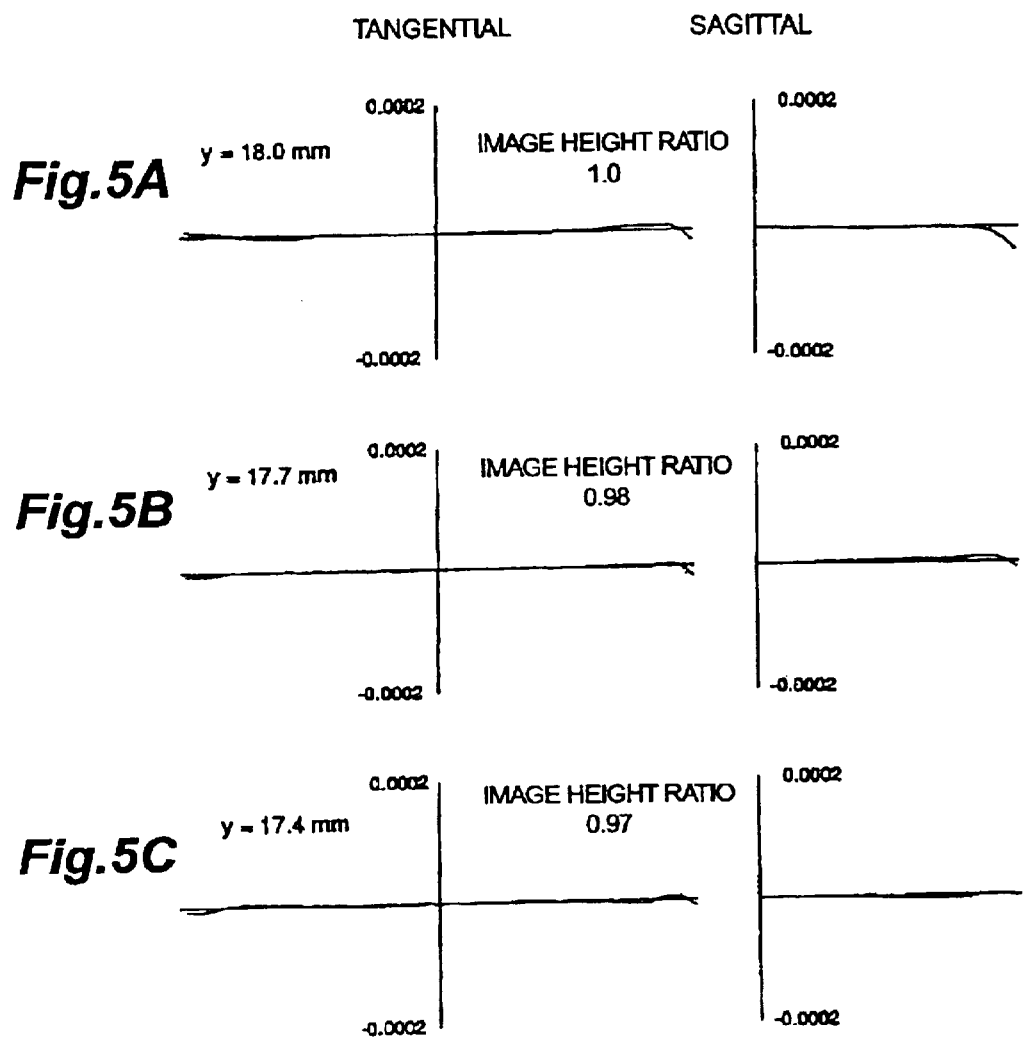
FIGS. 5A, 5B and 5C are diagrams illustrating a transverse aberration of the projection optical system according to the second embodiment.

$K = 0.0$
$A = +2.63882 \times 10^{-9}$  $B = +1.33848 \times 10^{-14}$  $C = +1.10810 \times 10^{-19}$
$D = +9.23515 \times 10^{-25}$  $E = +1.67508 \times 10^{-29}$  $F = +1.05644 \times 10^{-34}$
$G = 0.0$ FIGS. 5A, 5B and 5C are diagrams illustrating a transverse aberration of the optical system according to the second embodiment. As apparent from FIGS. 5A, 5B and 5C the aberrations are corrected in a satisfactory balance in the whole exposed area. For the exposure wavelength, on the other hand, all the wavelengths could be employed, and a sufficient resolution can be obtained even with a soft X-ray of about 13 nm. From the foregoing Formula of the resolution W, a resolution of 12 nm or higher is obtained in the present embodiment.

[Third Embodiment]

Figure 6:
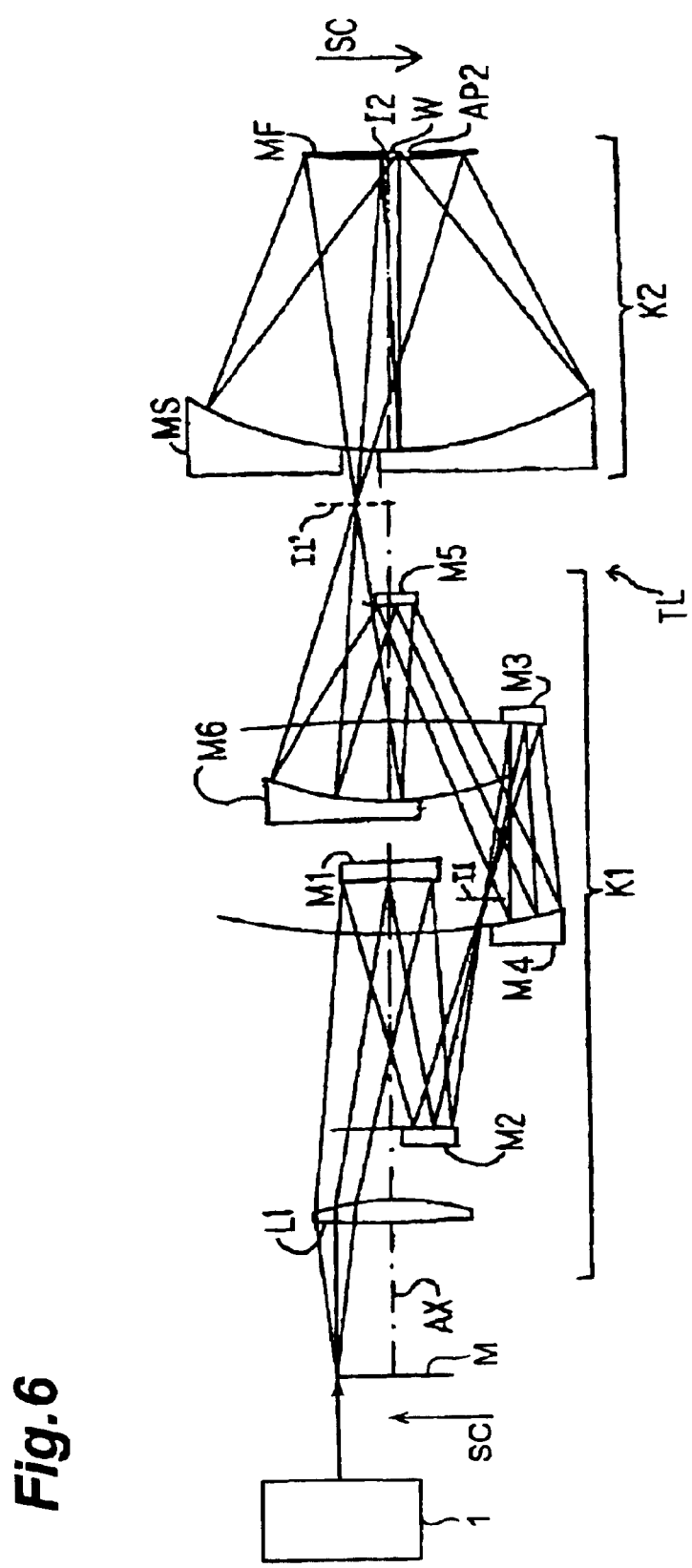
FIG. 6 is a diagram showing a lens construction of a projection optical system according to a third embodiment.

FIG. 6 is a diagram showing a schematic construction of a projection optical system according to a third embodiment. The present projection optical system is one suited for a scanning type projection exposure apparatus. The projection optical system has at least one refractive lens component L1 in the first imaging optical system when an exposure radiation of 100 to 200 nm is used, and employs a transmission type mask to make the optical systems telecentric on both the sides of the mask M and the wafer W. As a result, the image distortion can be reduced even when the positions of the mask M and/or the wafer W are displaced in the axial direction.

The present projection optical system TL is constructed to include: a first imaging optical system K1 for forming two intermediate images I1 and I1' of the pattern of a mask M or a first plane; and a second imaging optical system K2 based on the emitted radiation from the intermediate image I1' for forming a final image I2 of the pattern of the mask M at a reduced magnification on a photosensitive substrate or wafer W. Here, the first imaging optical system K1 further includes: a first auxiliary imaging optical system for forming the first intermediate image I1; and a second auxiliary imaging optical system for forming the second intermediate image I1'. Of these two intermediate images, on the other hand, the image I1 is formed in the first imaging optical system K1. And, all the optical elements composing the projection optical system TL have their optical axes aligned on the common straight line AX.

The first imaging optical system K1 is constructed to include a positive lens component L1 made of a fluorite, a reflecting mirror M1 of a positive power (a concave shape), a reflecting mirror M2 of a negative power (a convex shape), reflecting mirrors M3 and M4 of positive powers (concave shapes), a reflecting mirror M5 of a negative power (a convex shape) and a reflecting mirror M6 of a positive power (a concave shape). The emitted radiation, as emitted from a radiation source 1, irradiates the mask and the emitted radiation from the mask M passes through the lens component L1 and is reflected through the reflecting mirrors M1 and M2 so that the first intermediate image I1 of the pattern of the mask M is formed. And, the emitted radiation from the first intermediate image I1 is reflected sequentially through the reflecting mirrors M3 to M6 to form the second intermediate image I1' of the pattern of the mask M.

On the other hand, the second imaging optical system K2 is constructed to include a primary mirror MS of a positive power (a concave shape) disposed in the vicinity of the second intermediate image I1', and an auxiliary mirror MF disposed closer to the wafer W than the primary mirror MS. And, this primary mirror MS has a first aperture AP1 and a reflecting surface of a positive power (a concave shape). On the other hand, the auxiliary mirror MF has a second aperture AP2.

The emitted radiation from the second intermediate image I1' is reflected through the first aperture AP1 of the primary mirror MS on the reflecting surface of the auxiliary mirror MF; the emitted radiation, as reflected on the reflecting surface of the auxiliary mirror MF, is reflected on the first reflecting surface of the primary mirror MS; and the emitted radiation, as reflected on the first reflecting surface of the primary mirror MS, forms the final image I2 on the wafer W through the second aperture AP2 of the auxiliary mirror MF.

On the other hand, the shading area SA is provided on the reflecting mirror M1. The shape of the shading area and the method of separating the forward/backward optical paths in the present embodiment are similar to those of the first and second embodiments, and their description will be omitted.

On the other hand, the exposed area is an arcuate area having a radius of 18.0 to 19.0 mm on an optical axis AX, and a field size of a width of 20 mm can be used in the scanning direction, as indicated by arrow SC in FIG. 6.

The item values of the projection optical system according to the third embodiment are enumerated in Table 3. Here, the symbols appearing in Table 3 have definitions similar to those of Table 1, and the aspherical plane ASP is expressed by the foregoing Formula.

TABLE 3

(Entire Items)

$|\beta| = 1/5$
$NA = 0.6$
$\lambda = 157.6$ nm (Lens Data)

| Plane ∞ | r | d | Parts No. | ASP No. |
|---|---|---|---|---|
| Object Plane | ∞(Plane) | 263.4565 | | |
| 1 | 2479.0687 | 40.0000 | | (ASP1) |
| 2 | −383.5450 | 565.2289 | | |
| 3 | −887.4658 | −439.0230 | M1 | (ASP2) |
| 4 | −2841.3370 | 722.7922 | M2 | (ASP3) |
| 5 | −2891.3039 | −379.5252 | M3 | (ASP4) |
| 6 | 1110.0721 | 586.4748 | M4 | (ASP5) |
| 7 | 227.0279 | −349.3936 | M5 | (ASP6) |
| 8 | 501.9045 | 624.7526 | M6 | (ASP7) |
| 9 | 643.9023 | 501.4658 | | (ASP8) |
| 10 | 1840.0726 | −501.4568 | MF | (ASP9) |
| 11 | 643.9023 | 501.4568 | MS | (ASP8) |
| 12 | 1840.0726 | 12.0189 | MF | (ASP9) |

Image Plane ∞(Plane)

(ASP Coefficient)

ASP 1

K = 0.0
A = +2.30448 × $10^{-9}$   B = +1.13165 × $10^{-13}$   C = −1.39325 × $10^{-18}$
D = +6.71757 × $10^{-23}$   E = −1.78015 × $10^{-28}$   F = 0.0
G = 0.0

ASP2

K = 0.0
A = −9.00367 × $10^{-12}$   B = −1.70544 × $10^{-15}$   C = +2.22076 × $10^{-19}$
D = −2.01303 × $10^{-23}$   E = +7.12282 × $10^{-28}$   F = 0.0
G = 0.0

ASP3

K = 0.0
A = −6.84682 × $10^{-10}$   B = +2.67262 × $10^{-14}$   C = +2.74126 × $10^{-19}$
D = +8.28256 × $10^{-24}$   E = −9.54339 × $10^{-28}$   F = 0.0
G = 0.0

ASP4

K = 0.0
A = −2.08860 × $10^{-10}$   B = +1.31172 × $10^{-15}$   C = +1.84845 × $10^{-20}$
D = −4.08467 × $10^{-25}$   E = +2.36681 × $10^{-30}$   F = 0.0
G = 0.0

ASP5

K = 0.0
A = −7.33327 × $10^{-11}$   B = +6.71066 × $10^{-16}$   C = +1.15484 × $10^{-21}$
D = −3.80746 × $10^{-26}$   E = +2.79655 × $10^{-31}$   F = 0.0
G = 0.0

ASP6

TABLE 3-continued

K = 0.0
A = −5.25543 × 10$^{-9}$   B = −3.16151 × 10$^{-12}$   C = −2.62060 × 10$^{-16}$
D = −3.35651 × 10$^{-20}$  E = −2.91797 × 10$^{-24}$   F = 0.0
G = 0.0
ASP7

K = 0.0
A = +1.44360 × 10$^{-11}$  B = −2.14462 × 10$^{-16}$   C = −1.67798 × 10$^{-21}$
D = +9.06834 × 10$^{-27}$  E = −7.63759 × 10$^{-32}$   F = +2.25607 × 10$^{-37}$
G = 0.0
ASP8

K = 0.0
A = +6.51659 × 10$^{-11}$  B = +2.13530 × 10$^{-16}$   C = +5.23678 × 10$^{-22}$
D = +1.82979 × 10$^{-27}$  E = −1.14243 × 10$^{-33}$   F = +3.10978 × 10$^{-38}$
G = 0.0
ASP9

K = 0.0
A = +2.77031 × 10$^{-9}$   B = +1.70548 × 10$^{-14}$   C = +1.37306 × 10$^{-19}$
D = +1.89384 × 10$^{-24}$  E = −5.47709 × 10$^{-33}$   F = +7.47324 × 10$^{-34}$
G = 0.0

Figure 7:
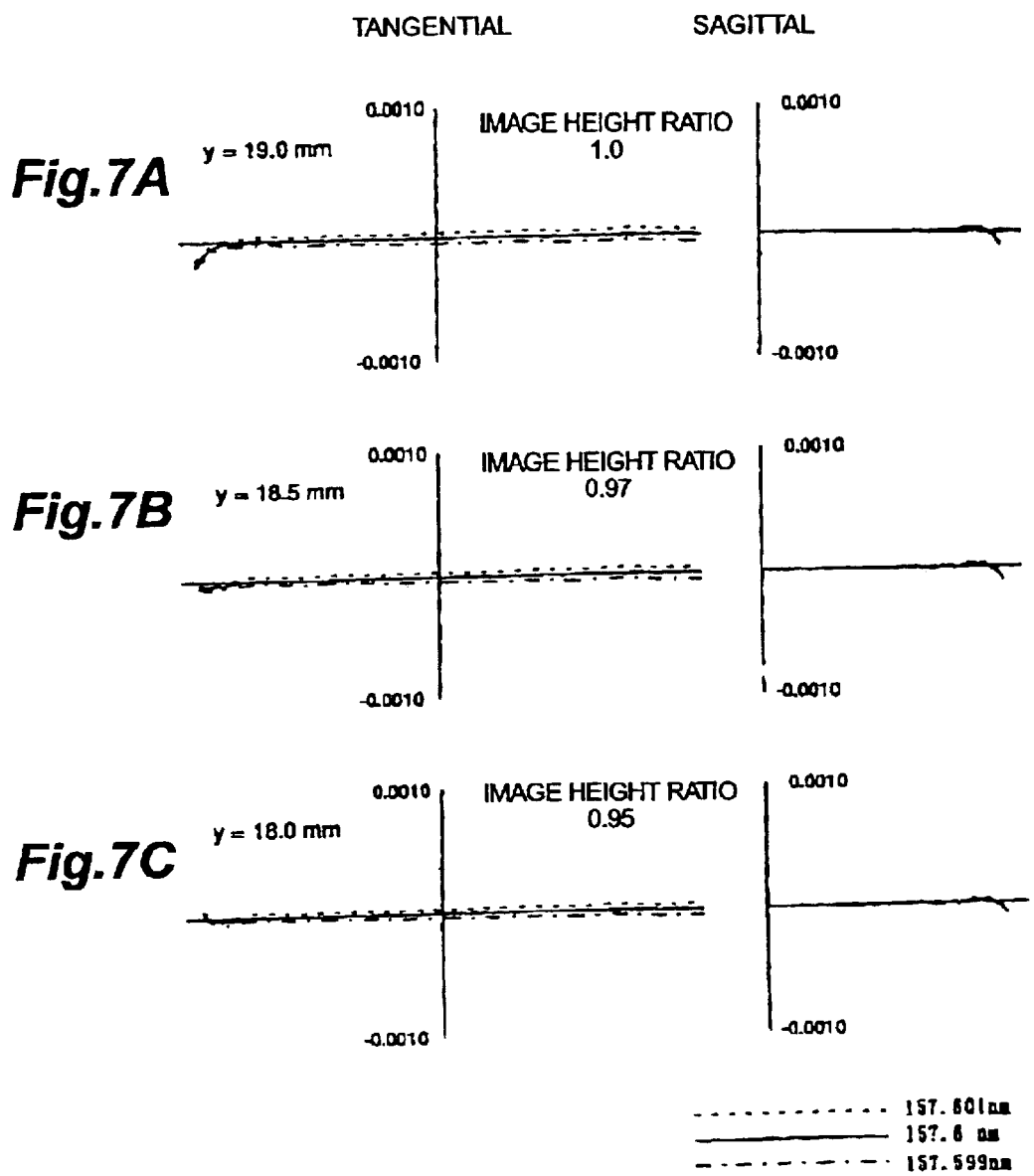
FIGS. 7A, 7B and 7C are diagrams illustrating a transverse aberration of the projection optical system according to the third embodiment.

FIGS. 7A, 7B and 7C are diagrams illustrating a transverse aberration of the optical system according to the third embodiment. In this aberration diagram, a solid line, a broken line and a single-dotted line plot a reference wavelength ($\lambda$=157.6 nm), $\lambda$=157.601 nm and $\lambda$=157.599 respectively. Although the projection optical system according to the present embodiment is designed for the exposure wavelength of $\lambda$=157.6 nm, it is enabled to cover the exposure radiation of a wavelength within 100 to 200 nm by a radiation change of the design. Here, the refractive index n of the fluorite is n=1.5559238 at $\lambda$=157.6 nm, and dn/d$\lambda$=−2.4×10$_{-10}$. For the entire exposure area within the range of 157±1 ppm, the aberrations are corrected in a satisfactory balance in the whole exposed area, as apparent from the figure.

In the third embodiment, the fluorite (i.e., calcium fluoride (CaF$_2$) is used as a material for the refractive lens component, which should not be limited to the fluorite. In the exposure wavelength of 160 nm or less, there can be used as the material for the refractive lens component a fluoride which is preferably selected from the group consisting essentially of: the fluorite (calcium fluoride (CaF$_2$), barium fluoride (BaF$_2$), lithium fluoride (LiF), magnesium fluoride (MgF$_2$), strontium fluoride (SrF$_2$), lithium-calcium-alminium-fluoride (LiCaAlF$_6$) and lithium-strontium-aluminium-fluoride (LiSrAlF$_6$). On the other hand, a diffraction optical element may be added to the projection optical system to utilize the effect of chromatic aberration additionally by the diffraction optical element.

[Fourth Embodiment]

Figure 8:
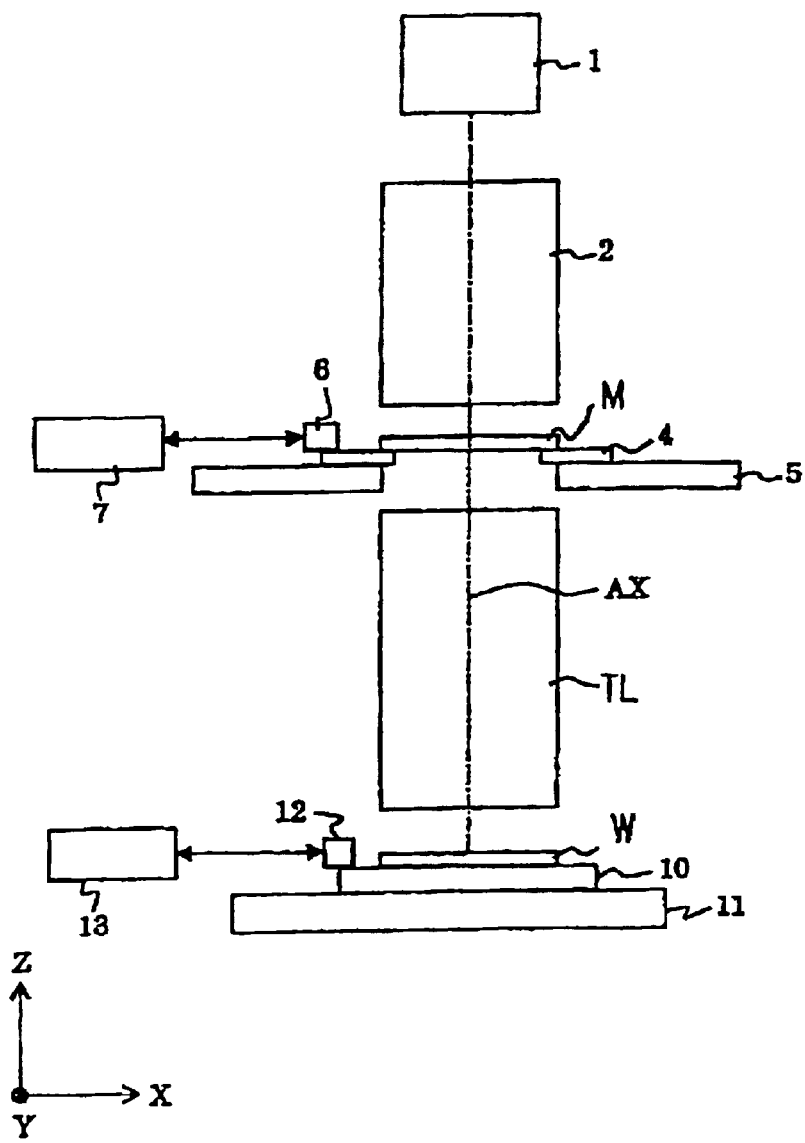
FIG. 8 is a diagram showing a construction of a projection exposure apparatus which is provided with the projection optical system according to the embodiments of the invention.

FIG. 8 is a diagram showing a construction of a projection exposure apparatus which is provided with the projection optical systems according to the foregoing individual embodiments of the invention. In FIG. 8, a Z-axis is set in parallel with the optical axis AX of the projection optical system TL constructing the projection exposure apparatus; an X-axis is set in parallel with the sheet surface of FIG. 8 and in a plane perpendicular to the optical axis AX; and a Y-axis is set normal to the sheet surface. On the object place of the projection optical system TL, on the other hand, there is arranged the mask M as a projection original having a predetermined circuit pattern formed thereon. On the image plane of the projection optical system TL, there is arranged the wafer W to which a photoresist is applied as the substrate.

The emitted radiation, as emitted from a radiation source 1, irradiates the mask M having the predetermined pattern homogeneously through an illumination optical system 2. On the optical path from the radiation source 1 to the illumination optical system 2, there is arranged one or a plurality of deflecting mirrors, if necessary, for changing the optical path.

On the other hand, the illumination optical system 2 is constructed, for example, to include: a fly-eye lens for homogenizing the illuminance distribution of the exposure radiation; an optical integrator having an internal reflection type integrator for forming a surface illuminant having a predetermined size/shape; a variable field stop (or reticle blind) for regulating the size/shape of the illumination area on the mask M; and an optical system such as a field stop imaging optical system for projecting the image of the field stop on the mask.

The mask M is held through a reticle holder 4 in parallel with the X-Y plane on a reticle stage 5. A pattern to be transferred is formed on the mask M, the pattern area of which is irradiated all over with the radiation coming from the illumination optical system 2. The reticle stage 5 can be moved two-dimensionally along the mask plane (i.e., the X-Y plane) by the actions of the not-shown drive system. The location coordinates of the reticle stage 5 are measured and positioned by an interferometer 7 using a mask carrier mirror 6.

The radiation from the pattern formed on the mask M forms a mask pattern image through the projection optical system TL on the wafer W or the photosensitive substrate. The projection optical system TL is equipped, in the vicinity of its pupil position, with the aperture stop S2 (as should be referred to FIG. 1) having a variable aperture, and is made substantially telecentric on the sides of the mask M and the wafer W.

The wafer W is held through a wafer holder 10 on a wafer stage 11 in parallel with the X-Y plane. And, the pattern image is formed in the exposure area having a shape substantially similar to the illumination area on the mask M. The wafer stage 11 can be moved two-dimensionally along the wafer plane (i.e., the X-Y plane) by the actions of the not-shown drive system. The location coordinates of the wafer stage 11 are measured and positioned by an interferometer 13 using a wafer carrier mirror 12.

As described above, the field area (or illumination area) on the mask M and the projection area (or exposure area) on the wafer W, as defined by the projection optical system TL, are formed into rectangular shapes having a shorter side in the X-direction. Therefore, the drive systems and the interferometers (7, 13) are used to position the mask 3 and the wafer W, and the not-shown auto-focus/auto-leveling system is used to position the wafer W on the imaging plane of the projection optical system. In the shorter side direction of the rectangular exposure area and illumination area, i.e., in the X-direction, moreover, the mask stage 5 and the wafer stage 11, and accordingly the mask M and the wafer W are synchronously moved (or scanned) to scan and expose the mask pattern on the wafer W with respect to the area which has a width equal to the longer side of the exposure area and a length according to the scanning (or movement) of the wafer W.

Here, the embodiment of FIG. 8 adopts the step-and-scan method, but the exposure apparatus of the present embodiment may be exemplified by the stitching and slit-scan type. When this stitching and slit-scan type is adopted, the reticle and the substrate are synchronously scanned in a predetermined first direction relative to the illumination area of a predetermined shape on the reticle, to expose the area of a first row on the substrate. After this, the reticle is either replaced or moved a predetermined distance in a second direction perpendicular to the first direction of the illumination area, thereby to shift the substrate transversely in the direction conjugate with the second direction of the illumination area. Then, the reticle and the substrate are synchronously scanned again in the first direction relative to the illumination area of the predetermined shape on the reticle, thereby to expose the area of a second row on the substrate.

In this stitching and slit-scan type exposure apparatus, a wider area on the substrate than the exposure field of the projection optical system can be exposed to the pattern of the reticle. Here, this stitching and slit-scan type exposure apparatus has been disclosed in U.S. Pat. No. 5,477,304, Japanese Patent Laid-Open No. 330220/1996, and Japanese Patent Laid-Open Nos. 148241/1997 and 284408/1998. U.S. patent application Ser. No. 654,747, as filed on May 29, 1996, is incorporated by reference for explanation of the switching and slit-scan type exposure apparatus.

Here, the present invention can adopt the batch exposure method by which the pattern image on the reticle is batch-transferred to a predetermined shot area on the substrate.

On the other hand, the embodiment of FIG. 8 is provided with one wafer stage for holding the wafer as the work (or photosensitive substrate) but may be constructed to include two sets of wafer stages, as disclosed in Japanese Patent Laid-Open No. 175098/1993 and EP951054A. U.S. patent application Ser. No. 980,315, as filed on Nov. 28, 1997, is incorporated by reference for explanation of the above.

To the first and second embodiments, there can be applied as the radiation source the SOR or laser plasma X-ray source for supplying an emitted radiation (of soft X-ray) having a wavelength of about 13 nm. On the other hand, the wavelength per se is not restricted because of the catoptric optical system. This makes it possible to use a hard X-ray of about 1 nm, a radiation of a wavelength of about 26 nm or about 39 nm, an ultraviolet radiation (light) such as the g-line or i-line, a deep ultraviolet (DUV) radiation such as the radiation from the KeF excimer laser, the $F_2$ laser or $Kr_2$ laser.

When the radiation source of SOR or laser plasma X-ray source for supplying an emitted radiation with wavelength of about 13 nm (soft X-ray) apply to the first and second embodiments, a reflection type mask is used as the reticle (projection original), and reflection optical members is used as optical members in the illumination optical system.

The third embodiment has a refractive member so that it can use an ultraviolet radiation such as the g-line and i-line, a deep ultraviolet (DUV) radiation such as the KrF excimer laser, or a vacuum ultraviolet (VUV) radiation such as the ArF excimer laser, the $F_2$ laser, the $Kr_2$ laser or the $Ar_2$ laser. The radiation source may be exemplified by higher harmonics of the solid laser such as the YAG laser having an oscillatory spectrum at any of the wavelengths of 248 nm, 193 nm, 157 nm, 146 nm and 126 nm.

When the emitted radiation having a wavelength of 100 nm or less is used, on the other hand, the optical path from the mask (or first plane) to the wafer (or second plane) is in the vacuum atmosphere. When an emitted radiation in a vacuum ultraviolet region of 160 nm or less is used, on the other hand, the optical path from the mask (or first plane) to the wafer (or second plane) is replaced by the helium gas atmosphere.

On the other hand, the projection optical system may have a multiplying factor not only for reduction but also for equalization or magnification.

Moreover, the invention can be applied not only to an exposure apparatus to be used for manufacturing semiconductor elements but also an exposure apparatus for transferring a device pattern to a glass plate, as used for manufacturing a display including a liquid crystal element, an exposure apparatus for transferring a device pattern to a ceramics wafer, as used for manufacturing a thin-film magnetic head, and an exposure apparatus to be used for manufacturing an imaging element (e.g., CCD). On the other hand, the invention can also be applied to an exposure apparatus for transferring a circuit pattern to a glass substrate or a silicon wafer so as to manufacture the reticle or mask.

With reference to a flow chart of FIG. 9, here will be described one example of the procedure for manufacturing a semiconductor device as a micro-device by using the projection exposure apparatus of the foregoing embodiments to form a predetermined circuit pattern on the wafer.

Figure 9:
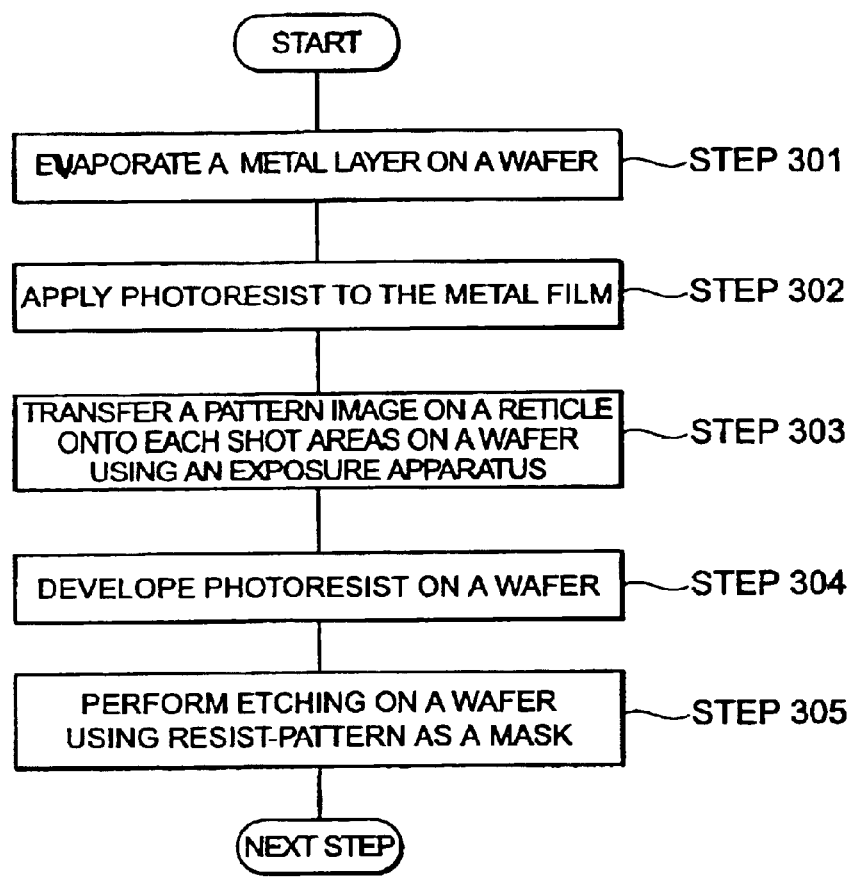
FIG. 9 is a flow chart showing one example of a process for manufacturing a semiconductor device by using the projection exposure apparatus.

First of all, a metal film is evaporated on the wafers of one lot at Step 301 of FIG. 9. At next Step 302, a photoresist is applied to the metal films on the wafers of the lot. After this, at Step 303, the projection exposure apparatus of FIG. 8, as provided with the projection optical system TL of any of the first to third embodiments, is used to expose and transfer the images of the pattern of a reticle R sequentially through the projection optical system TL to the individual shot areas on the wafers of the lot. After this, at Step 304, the photoresists on the wafers of the lot are developed. At Step 305, the wafers of the lot are etched by using the resist pattern as the mask so that the circuit pattern corresponding to the pattern on the reticle R is formed in each shot area on each wafer. After this, the circuit pattern of the overlying layer is formed to manufacture the device such as the semiconductor element.

According to the aforementioned semiconductor device manufacturing process, it is possible to produce a semiconductor device having an extremely fine circuit pattern.

According to the projection optical system of the invention, as has been described hereinbefore, it is possible to provide a projection optical system which has a large numerical aperture in a soft X-ray wavelength range of 200 nm or less, especially 100 nm or less and which has a resolution far smaller than 50 nm. On the other hand, the projection exposure apparatus according to the invention is provided with the projection optical system so that it can manufacture devices having fine patterns.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A projection optical system for projecting an image on a first plane onto a second plane, comprising:

a first imaging optical system that forms an intermediate image of the first plane, and a second imaging optical system that forms a final image of the first plane onto the second plane based on an emitted radiation from the intermediate image;

all optical elements of the first and second imaging optical systems include reflecting faces;

a field area of the projection optical system is disposed in an area that does not contain an optical axis of the projection optical system;

wherein the first imaging optical system includes a shading area having a radially symmetrical shape in a pupil plane, and the first imaging optical system is an off-axis forward/backward optical path separation system in which an optical path of radiation incident to each reflecting face of the first imaging optical system differs from an optical path of radiation reflected from each reflecting face of the first imaging optical system; and wherein the second imaging optical system is a center aperture forward/backward optical path separation system in which an optical path of radiation incident to each reflecting face of the second imaging optical system differs from an optical path of radiation reflected from each reflecting face of the second imaging optical system, and the second imaging optical system includes at least one reflecting face that has an aperture portion.

2. The projection optical system according to claim 1, wherein:

the field area has an arcuate shape; and the radially symmetrical shape of the shading area is a ring shape.

3. The projection optical system according to claim 1, wherein a shape of the aperture portion in the at least one reflecting face of the second imaging optical system is asymmetrical.

4. The projection optical system according to claim 2, wherein a shape of the aperture portion in the at least one reflecting face of the second imaging optical system is radially asymmetrical.

5. The projection optical system according to claim 1, wherein the intermediate image is formed in a vicinity of the aperture portion in the at least one reflecting face of the second imaging optical system.

6. The projection optical system according to claim 2, wherein the intermediate image is formed in a vicinity of the aperture portion in the at least one reflecting face of the second imaging optical system.

7. The projection optical system according to claim 3, wherein the intermediate image is formed in a vicinity of the aperture portion in the at least one reflecting face of the second imaging optical system.

8. The projection optical system according to claim 1, wherein the second imaging optical system at least includes a first mirror having a first aperture, and a second mirror having a second aperture, and the emitted radiation from the intermediate image is reflected on a reflecting face of the second mirror after having passed through the first aperture of the first mirror, the emitted radiation reflected on the reflecting face of the second mirror is then reflected on a reflecting face of the first mirror, and the emitted radiation reflected on the reflecting face of the first mirror forms the final image after having passed through the second aperture of the second mirror.

9. The projection optical system according to claim 2, wherein the second imaging optical system at least includes a first mirror having a first aperture, and a second mirror having a second aperture, and the emitted radiation from the intermediate image is reflected on a reflecting face of the second mirror after having passed through the first aperture of the first mirror, the emitted radiation reflected on the reflecting face of the second mirror is then reflected on a reflecting face of the first mirror, and the emitted radiation reflected on the reflecting face of the first mirror forms the final image after having passed through the second aperture of the second mirror.

10. The projection optical system according to claim 3, wherein the second imaging optical system at least includes a first mirror having a first aperture, and a second mirror having a second aperture, and the emitted radiation from the intermediate image is reflected on a reflecting face of the second mirror after having passed through the first aperture of the first mirror, the emitted radiation reflected on the reflecting face of the second mirror is then reflected on a reflecting face of the first mirror, and the emitted radiation reflected on the reflecting face of the first mirror forms the final image after having passed through the second aperture of the second mirror.

11. The projection optical system according to claim 4, wherein the second imaging optical system at least includes a first mirror having a first aperture, and a second mirror having a second aperture, and the emitted radiation from the intermediate image is reflected on a reflecting face of the second mirror after having passed through the first aperture of the first mirror, the emitted radiation reflected on the reflecting face of the second mirror is then reflected on a reflecting face of the first mirror, and the emitted radiation reflected on the reflecting face of the first mirror forms the final image after having passed through the second aperture of the second mirror.

12. A projection exposure apparatus for projecting and transferring an image of a mask, in which a predetermined pattern is formed, onto a photosensitive substrate comprising:

a radiation source which supplies an emitted radiation having a predetermined wavelength;

the projection optical system according to claim 1;

a first stage which positions the mask on the first plane; and a second stage which positions the photosensitive substrate on the second plane.

13. A projection exposure apparatus for projecting and transferring an image of a mask, in which a predetermined pattern is formed, onto a photosensitive substrate comprising:

a radiation source which supplies an emitted radiation having a predetermined wavelength;

the projection optical system according to claim 2;

a first stage which positions the mask on the first plane; and a second stage which positions the photosensitive substrate on the second plane.

14. A projection exposure apparatus for projecting and transferring an image of a mask, in which a predetermined pattern is formed, onto a photosensitive substrate comprising:

a radiation source which supplies an emitted radiation having a predetermined wavelength;

the projection optical system according to claim 3;

a first stage which positions the mask on the first plane; and a second stage which positions the photosensitive substrate on the second plane.

15. A projection exposure apparatus for projecting and transferring an image of a mask, in which a predetermined pattern is formed, onto a photosensitive substrate comprising:

a radiation source which supplies an emitted radiation having a predetermined wavelength; 9 the projection optical system according to claim 4;

a first stage which positions the mask on the first plane; and a second stage which positions the photosensitive substrate on the second plane.

16. A projection exposure apparatus for projecting and transferring an image of a mask, in which a predetermined pattern is formed, onto a photosensitive substrate comprising:

a radiation source which supplies an emitted radiation having a predetermined wavelength;

the projection optical system according to claim 5;

a first stage which positions the mask on the first plane; and a second stage which positions the photosensitive substrate on the second plane.

17. The projection exposure apparatus according to claim 12, wherein the wavelength of the emitted radiation is not longer than 100 nm.

18. A method for manufacturing a micro device, the method comprising the steps of:

exposing the pattern of the mask onto the photosensitive substrate by using the projection exposure apparatus according to claim 12; and developing the photosensitive substrate having been exposed in the exposing step.

19. A method for manufacturing a micro device, the method comprising the steps of:

exposing the pattern of the mask onto the photosensitive substrate by using the projection exposure apparatus according to claim 17, and developing the photosensitive substrate having been exposed in the exposing step.

20. The projection optical system according to claim 1, wherein the shading area is a surface of an optical element of the first imaging optical system, the surface having a reflectivity that is substantially lower than a reflectivity of the reflecting face of the optical element.

* * * * *